US007900808B2

(12) United States Patent
Huang et al.

(10) Patent No.: US 7,900,808 B2
(45) Date of Patent: Mar. 8, 2011

(54) SOLDERING METHOD AND SYSTEM THEREOF

(75) Inventors: Po-Shan Huang, Miao-Li (TW); Jia-Shyong Cheng, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 0 days.

(21) Appl. No.: 12/384,361

(22) Filed: Apr. 3, 2009

(65) Prior Publication Data
US 2009/0250507 A1  Oct. 8, 2009

(30) Foreign Application Priority Data
Apr. 3, 2008 (TW) .............................. 97112276 A

(51) Int. Cl.
*B23K 1/00* (2006.01)
*B23K 101/42* (2006.01)

(52) U.S. Cl. ................................... 228/122.1; 228/123.1

(58) Field of Classification Search ............... 228/122.1, 228/123.1
See application file for complete search history.

(56) References Cited

U.S. PATENT DOCUMENTS

| 2004/0036181 | A1 | 2/2004 | Hedler et al. |
| 2004/0134976 | A1 | 7/2004 | Keyser et al. |
| 2007/0139134 | A1* | 6/2007 | Ratell et al. ................... 333/134 |
| 2009/0051004 | A1* | 2/2009 | Roth et al. ..................... 257/531 |

* cited by examiner

*Primary Examiner* — Jessica L Ward
*Assistant Examiner* — Erin B Saad
(74) *Attorney, Agent, or Firm* — Wei Te Chung

(57) ABSTRACT

A soldering system includes a circuit board having first soldering terminals, a soldering object having second soldering terminals, soldering blocks disposed between the circuit board and the soldering object for electrically interconnecting the first soldering terminals and the second soldering terminals respectively, and a supporting structure supporting the soldering object and having a height that determines the height of the solder blocks. A related soldering method is also provided.

8 Claims, 3 Drawing Sheets

US 7,900,808 B2

SOLDERING METHOD AND SYSTEM THEREOF

CROSS-REFERENCE TO RELATED APPLICATION

This application is related to, and claims the benefit of, a foreign priority application filed in Taiwan as Serial No. 097112276 on Apr. 3, 2008. The related application is incorporated herein by reference.

BACKGROUND

1. Technical Field

The present invention relates to soldering systems and methods, and more particularly to a soldering system and method using a supporting structure.

2. Description of Related Art

Electronic devices typically employ printed circuit boards (PCBs) to carry electronic elements and function circuits therein. For example, a power supply circuit, a driving circuit, and other circuits may be accommodated in an electronic device. Moreover, a flexible printed circuit board (FPCB) enables electrical communication between two function circuits respectively disposed on different PCBs.

Generally, a PCB includes a plurality of parallel elongate metal terminals (herein called gold fingers) configured for soldering to a corresponding FPCB. The FPCB includes a plurality of soldering spots, each of which corresponds to a respective gold finger of the PCB. The gold fingers can be attached to the soldering spots by solder material.

In a typical soldering process, solder balls are attached on the golden fingers of the PCB, and the FPCB is aligned with the PCB so as to be sandwiched between the golden fingers and the corresponding soldering spots. The solder balls are heated and melt, and external force is applied at the same time to maximize contact between the FPCB and PCB. After the heating is finished, the melted solder balls re-solidify as solder bumps. Thereby, the golden fingers are attached to the corresponding soldering spots, with electrical connection between the FPCB and the PCB formed as a result.

During this soldering process, the applied external force must be controlled accurately. Otherwise, the melted solder ball on a golden finger may extend to an adjacent melted solder ball and result in unwanted connection. However, due to trends toward compactness in electronic device development, spaces between adjacent golden fingers are becoming smaller. Thus, accurate control requirements are increased, creating difficulty in most manufacturing environments and inflating costs.

What is needed is a soldering method which can overcome the above deficiencies, and a soldering system using the same.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe exemplary embodiments of the present disclosure in detail.

Figure 1:
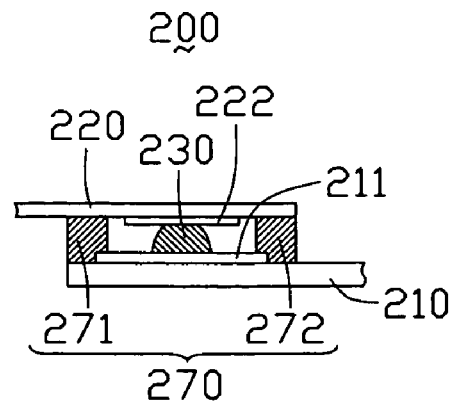
FIG. 1 is a cross-section of part of a first embodiment of a soldering system according to the present disclosure, including a circuit board and a soldering object.

FIG. 1 is a cross-section of a first embodiment of a soldering system 200 of the present disclosure. The soldering system 200 includes a circuit board 210, a soldering object 220, a plurality of solder blocks 230 (only one is shown), and a supporting structure 270. The soldering object 220 is electrically connected to the circuit board 210 by the solder blocks 230. The supporting structure 270 supports the soldering object 220, providing a gap between the circuit board 210 and the soldering object 220.

Figure 2:
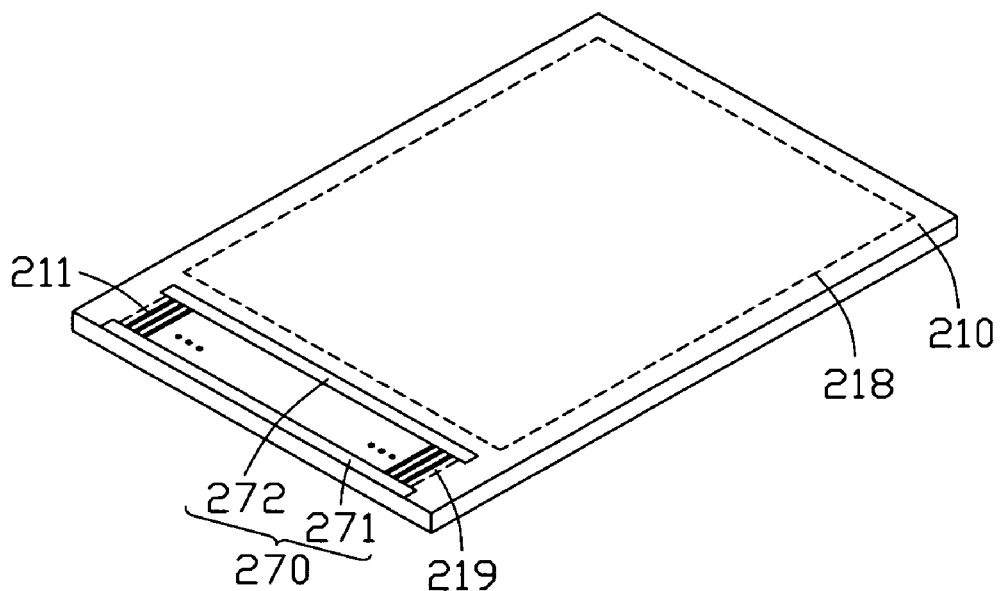
FIG. 2 is an isometric view of an entire circuit board of the soldering system of FIG. 1.

FIG. 2 is an isometric view of the circuit board 210 of the soldering system 200. The circuit board 210 can be a PCB. A main region 218 is located at a substantial center of the circuit board 210, and a soldering region 219 located at an edge of the circuit board 210. The main region 218 includes a plurality of electronic elements (not shown) cooperatively forming a function circuit. These electronic elements can be mounted on the main region 218 via surface mount technology (SMT). The soldering region 219 includes a plurality of first terminals 211 connected to the electronic elements. The first terminals 211 are longitudinal and parallel. The first terminals 211 can be metal.

The supporting structure 270 includes a first spacer 271 away from the main region 218 and a second spacer 272 adjacent to the main region 218. The first spacer 271 and the second spacer 272 are longitudinal and parallel, and intersect the first terminals 211. The first spacer 271 and the second spacer 272 superpose the first terminals 211 in part, respectively. The material of the first spacer 271 and the second spacer 272 can be insulating tape or paint.

Figure 3:
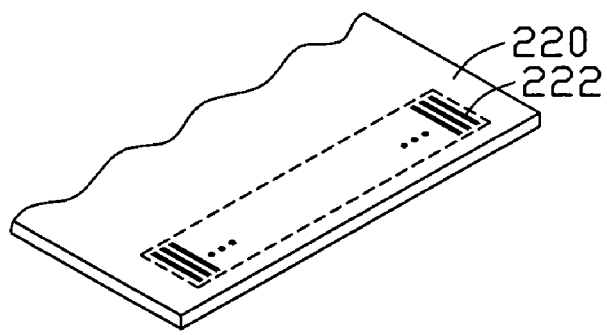
FIG. 3 is an isometric view of an entire soldering object of the soldering system of FIG. 1.

FIG. 3 is an isometric view of the soldering object 220 of the soldering system 270 of FIG. 1. The soldering object 220 can be an FPCB with a thickness less than 300 microns (μm). The soldering object 220 includes a plurality of second terminals 222 corresponding to the first terminals 211 respectively. The second terminals 222 are longitudinal and parallel. The second terminals 222 can also be metal.

The soldering object 220 is soldered on the circuit board 210 via the solder blocks 230. In particular, each first terminal 211 is soldered to a corresponding second terminal 222 via a respective solder block 230. The first spacer 271 and the second spacer 272 correspondingly support the soldering object 220, such that the solder blocks 230 are approximately the same height as the first spacer 271 and the second spacer 272, and the depth of the gap between the circuit board 210 and the soldering object 220. In the illustrated embodiment, a height of each of the solder blocks 230 is slightly less than a common height of the first and second spacers 271, 272, and slightly less than a height of the gap between each first terminal 211 and the soldering object 220.

Figure 4:
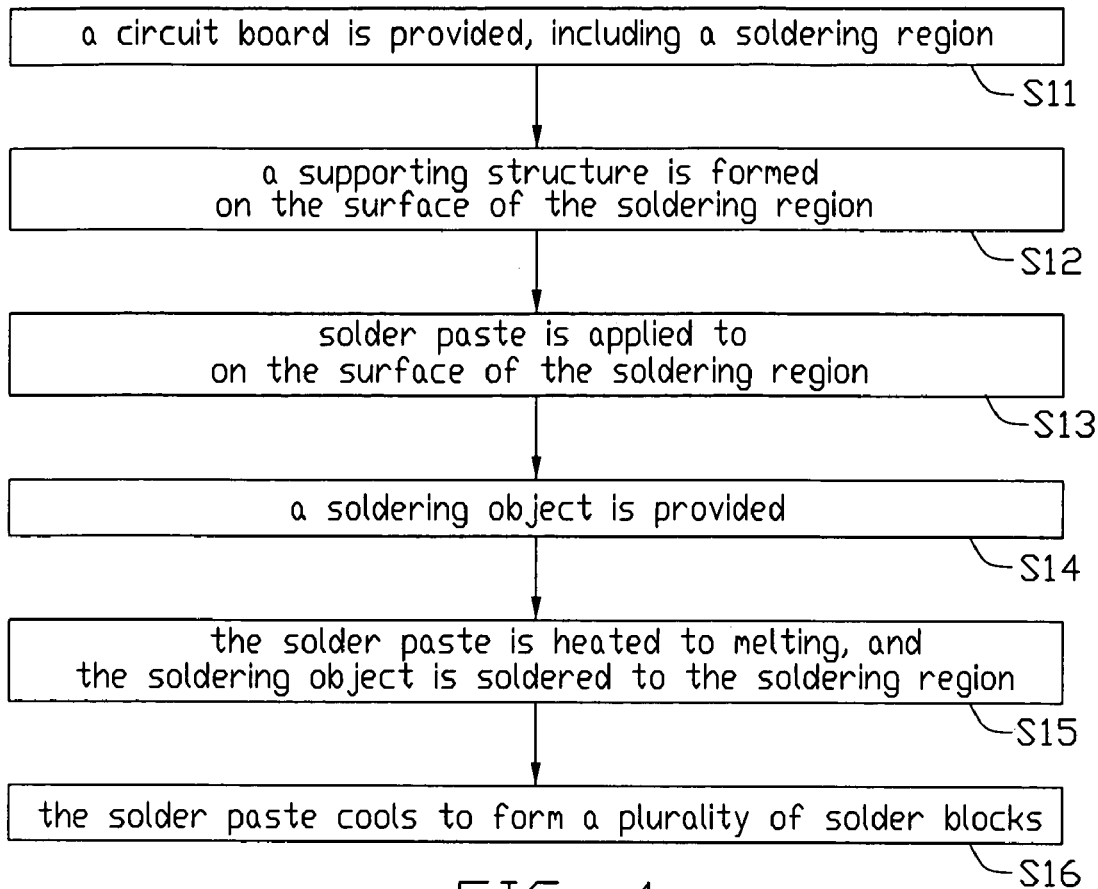
FIG. 4 is a flowchart of a soldering method using, as an example, the soldering system of FIG. 1.

The disclosed soldering system 200 can be used, as an example, in a disclosed soldering method as shown in FIG. 4. In step S11, a circuit board is provided, including a soldering region. In step S12, a supporting structure is formed on the surface of the soldering region. In step S13, solder paste is applied to the surface of the soldering region. In step S14, a soldering object is provided. In step S15, the solder paste is heated to melting, and the soldering object is soldered to the soldering region. In step S16, the solder paste cools to form a plurality of solder blocks.

Figure 5:
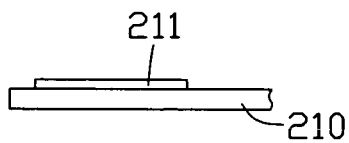
FIGS. 5-10 are cross-sections (or top views) of successive steps in the soldering method of FIG. 4.

In step S11, referring to FIG. 5, a circuit board 210 including a soldering region 219 is provided. The soldering region 219 includes a plurality of first terminals 211.

Figure 6:
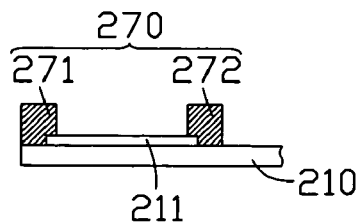

In step S12, referring to FIG. 6, a first spacer 271 and a second spacer 272 superposing two ends of the first terminals 211 respectively are formed on the circuit board 210. The first spacer 271 and the second spacer 272 can be insulating tapes pasted on the soldering region 219 or insulating paint printed on the soldering region 219.

Figure 7:
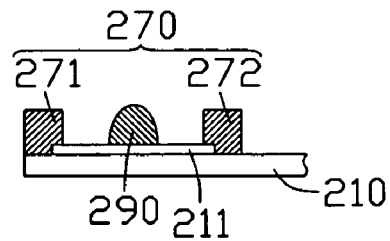
Figure 8:
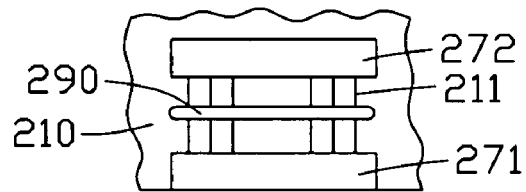

In step S13, referring to FIGS. 7-8, solder paste 290 is provided and coated on the first terminals 211 between the first spacer 271 and the second spacer 272. The solder paste 290 presents as a plurality of adhesive strips including tin powder and soldering flux. The soldering flux includes colophony and chemical solvent for controlling the viscosity and the fluidity of the tin powder.

Figure 9:

In step S14, referring to FIG. 9, a soldering object 220 is provided. The soldering object 220 can be an FPCB, which includes a plurality of second terminals 222.

Figure 10:
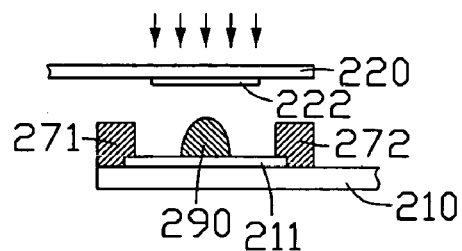

Referring to FIG. 10, the details of step S15 is as follows. Firstly, align the soldering object 220 with the circuit board 210. Secondly, exert external force to the soldering object 220 for pressing the solder paste 290. During this process, the first spacer 271 and the second spacer 272 support the soldering object 220 for maintaining a predetermined distance between the solder object 220 and the circuit board 210. Thirdly, heat the solder paste 290 till the solder paste 290 is melted. Due to the greater adhesive attraction between the solder paste 290, the first terminal 211, and the second terminal 222, the melted solder paste 290 is divided into a plurality of portions, each of which is concentrated to a gap between a respective pair of the first terminal 211 and the second terminal 222.

In step S16, the solder paste 290 is cooled, thereby forming a plurality of solder blocks 230. The first terminals 211 and the second terminals 222 are electrically connected by the solder blocks 230 respectively, such that the soldering object 220 is soldered on the circuit board 210. A height of the solder blocks 230 is approximately the same as that of the first spacer 271 and the second spacer 272.

The soldering method of the soldering system 200 includes forming a supporting structure 270, and maintaining the depth of the gap between the soldering object 220 and the circuit board 210 during soldering the soldering object 220 to the circuit board 210. As a result, the height of the solder blocks 230 can be controlled. Thus, the electrical connection of the first terminals 211 and the second terminals 222 is reliable, and the productivity of the soldering method is also improved.

Figure 11:
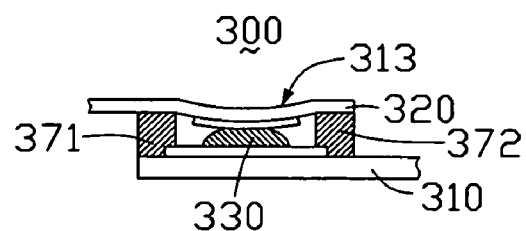
FIG. 11 is a cross-section of part of a second embodiment of a soldering system according to the present disclosure.

FIG. 11 is a cross-section of part of a second embodiment of a soldering system 300 according to the present disclosure, differing from the soldering system 200 only in that a surface away from a circuit board 310 of a soldering object 310 comprises a bending portion 313. The bending portion 313 superposes the soldering blocks 330, causing the height of the soldering block 330 to be somewhat less than a common height of a first spacer 371 and a second spacer 372. Electrical connection of the circuit board 310 and the soldering object 320 is further improved.

It is to be understood, however, that even though numerous characteristics and advantages of the present embodiments have been set out in the foregoing description, together with details of the structures and functions of the embodiments, the disclosure is illustrative only; and that changes may be made in detail, especially in matters of arrangement of parts within the principles of the disclosure to the full extent indicated by the broad general meaning of the terms in which the appended claims are expressed.

The invention claimed is:

1. A soldering method comprising:
providing a circuit board comprising a soldering region;
forming a supporting structure on the soldering region;
coating solder on the soldering region;
providing a soldering object, and arranging the soldering object to be supported by the supporting structure; and
soldering the soldering object on the soldering region via the solder,
wherein the soldering region comprises a plurality of first terminals with longitudinal elongate shapes and parallel to each other, the soldering object comprises a plurality of second terminals connected to the first terminals via the solder, and the supporting structure comprises a first spacer and a second spacer with elongate shapes and parallel to each other,
wherein the first spacer and the second spacer are substantially perpendicular to the plurality of first terminals, the first spacer contacts one end of each first terminal of the plurality of first terminals, and the second spacer contacts another end of each first terminal of the plurality of first terminals.

2. The soldering method of claim 1, wherein soldering the soldering object comprises heating the solder until the solder melts.

3. The soldering method of claim 2, further comprising cooling the solder so as to form a plurality of soldering blocks, the first terminals being connected to the second terminals via the soldering blocks respectively.

4. The soldering method of claim 1, wherein the supporting structure is insulating tape on the soldering region or insulating paint on the soldering region.

5. The soldering method of claim 1, wherein the soldering object comprises a bending portion having a concavity facing away from the circuit board.

6. The soldering method of claim 5, wherein the height of the soldering blocks is less than that of the first spacer and the second spacer.

7. The soldering method of claim 1, wherein the soldering object is a flexible printed circuit board (FPCB).

8. The soldering method of claim 7, wherein the thickness of the FPCB is less than 300 μm.

* * * * *